United States Patent
Weale

[11] Patent Number: 6,049,470
[45] Date of Patent: Apr. 11, 2000

[54] PACKAGE WITH RETICULATED BOND SHELF

[75] Inventor: Gareth P. Weale, New Hamburg, Canada

[73] Assignee: Dalsa, Inc., Canada

[21] Appl. No.: 09/006,662

[22] Filed: Jan. 13, 1998

Related U.S. Application Data

[60] Provisional application No. 60/048,349, May 30, 1997.

[51] Int. Cl.[7] .................................................. H05K 7/02
[52] U.S. Cl. .......................... 361/820; 361/760; 361/825; 361/826; 361/764; 361/782; 361/783; 361/719; 361/720; 257/668; 257/767; 257/691; 257/723; 257/724; 338/252; 338/272
[58] Field of Search ...................... 361/820, 821, 361/826, 825, 829, 760, 764, 765, 766, 782, 783, 719, 720; 257/676, 668, 691, 723, 775, 776, 696, 724; 338/252, 272

[56] References Cited

U.S. PATENT DOCUMENTS

| | | |
|---|---|---|
| 3,935,446 | 1/1976 | Michon . |
| 4,580,155 | 4/1986 | Tsoi et al. . |
| 5,029,190 | 7/1991 | Narabu et al. . |
| 5,321,299 | 6/1994 | Ohkawa et al. . |
| 5,357,129 | 10/1994 | Kamimura . |
| 5,412,538 | 5/1995 | Kikinis et al. ........................... 361/792 |
| 5,449,908 | 9/1995 | Wadsworth et al. . |
| 5,504,370 | 4/1996 | Lin et al. . |
| 5,543,641 | 8/1996 | Wadsworth et al. . |
| 5,598,035 | 1/1997 | Rusu et al. . |
| 5,600,696 | 2/1997 | Sauer . |
| 5,602,585 | 2/1997 | Dickinson et al. . |
| 5,616,952 | 4/1997 | Nakano et al. . |
| 5,731,633 | 3/1998 | Clayton .................................... 257/723 |
| 5,747,875 | 5/1998 | Oshima .................................... 257/687 |
| 5,767,579 | 6/1998 | Kanazawa et al. ...................... 257/717 |

Primary Examiner—Leo P. Picard
Assistant Examiner—David Foster
Attorney, Agent, or Firm—Banner & Witcoff, Ltd.

[57] ABSTRACT

A component package includes a case with a bond shelf and a conductive layer formed on the bond shelf. The bond shelf is characterized by an inward edge and an outward edge and at least one reticulation, each reticulation being characterized by an outward edge and an inward edge. The reticulation inward edge is co-linear with the bond shelf inward edge. The conductive layer includes a mounting pad for each reticulation and a serpentine conductor connecting the mounting pads, the mounting pad being disposed between the inward edge of the reticulation and the outward edge of the reticulation. The component package further includes a chip transistor mounted on a first mounting pad and a chip resistor mounted in a first reticulation. A semiconductor circuit mounted in the component package includes a bonding pad connected to a pad on the chip transistor and one end of the chip resistor.

20 Claims, 3 Drawing Sheets

PACKAGE WITH RETICULATED BOND SHELF

Priority benefit of the May 30, 1997 filing date of provisional application Ser. No. 60/048,349 is hearby claimed.

BACKGROUND OF THE INVENTION

1. Field of the Invention

The present invention relates to integrated circuit packaging. In particular, the invention relates to a package with a reticulated bond shelf into which supporting components are mounted to provide high speed and high output drive interface circuits.

2. Description of Related Art

Known integrated circuits are mounted in packages as depicted in FIGS. 5 and 6. As depicted in FIG. 5, the package includes case C (typically of a ceramic material) with bonding wire shelf BWS integrally formed therewith. The package further includes wires W of a wire frame (see both FIGS. 5 and 6) integrally formed with case C. Ends E of wires W of the wire frame penetrate case C and are disposed on bonding wire shelf BWS. Semiconductor circuit S is mounted in case C and includes a plurality of bonding pads P. Then, fine wires G, typically gold, are connected between each pad P and corresponding ends E of wires W. Lid L (FIG. 5) is then sealed on case C, and excess perimeter metal is trimmed off of the wire frame (FIG. 6).

In FIG. 4, an output arrangement is depicted for high density MOS (metaloxide-semiconductor) circuits or CCD (charge coupled device) circuits. In high density circuits, semiconductor circuit S is mounted in case C and includes sense node N connected to the gate of an MOS transistor. The MOS transistor is arranged in a source follower circuit without a load resistor connected to the source terminal of the MOS transistor. Instead, the source of the MOS transistor is wired to bonding pad P. During package assembly, bonding pad P is connected through gold bonding wire G to end E of wire W. The assembled package is mounted on, and wire W is soldered into, a known type of printed wiring board (e.g., copper clad epoxy laminates). Similarly, resistor R and bipolar transistor Q are mounted on the printed wiring board. The printed wiring board connects the base of bipolar transistor Q with wire W and one end of resistor R. The other end of resistor R is connected to ground so that resistor R functions as a load for the source follower arrangement of the MOS transistor. Bipolar transistor Q is arranged as an emitter follower circuit.

High density circuits have very little drive capability. For example, the voltage at node N (FIG. 4) cannot drive a load resistor directly. Thus, the MOS transistor of semiconductor circuit S is arranged as a source follower to achieve a significant current source capability at bonding pad P. This current source capability is loaded by resistor R and is followed by an emitter follower. In known arrangement such as the circuit depicted in FIG. 4, the current source capability of the source follower circuit must not only drive the load caused by resistor R, it must also drive parasitic capacitance. The parasitic capacitance between wire W, the base of bipolar transistor Q and resistor R is typically 10 to 15 picofarads. This capacitance is one of the principal factors responsible for limitations in the speed performance of the circuit.

SUMMARY OF THE INVENTION

It is an object of the present invention to achieve a high speed output for a large format semiconductor circuit. It is a further object of the present invention to minimize package size for a large format semiconductor circuit.

These and other objects are achieved in a component package that includes a case with a bond shelf and a conductive layer formed on the bond shelf. The bond shelf is characterized by an inward edge and an outward edge and at least one reticulation, each reticulation being characterized by an outward edge and an inward edge. The reticulation inward edge is co-linear with the bond shelf inward edge. The conductive layer includes a mounting pad for each reticulation and a serpentine conductor connecting the mounting pads, the mounting pad being disposed between the inward edge of the reticulation and the outward edge of the reticulation. The component package further includes a chip transistor mounted on a first mounting pad and a chip resistor mounted in a first reticulation. A semiconductor circuit mounted in the component package includes a bonding pad connected to a pad on the chip transistor and one end of the chip resistor.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
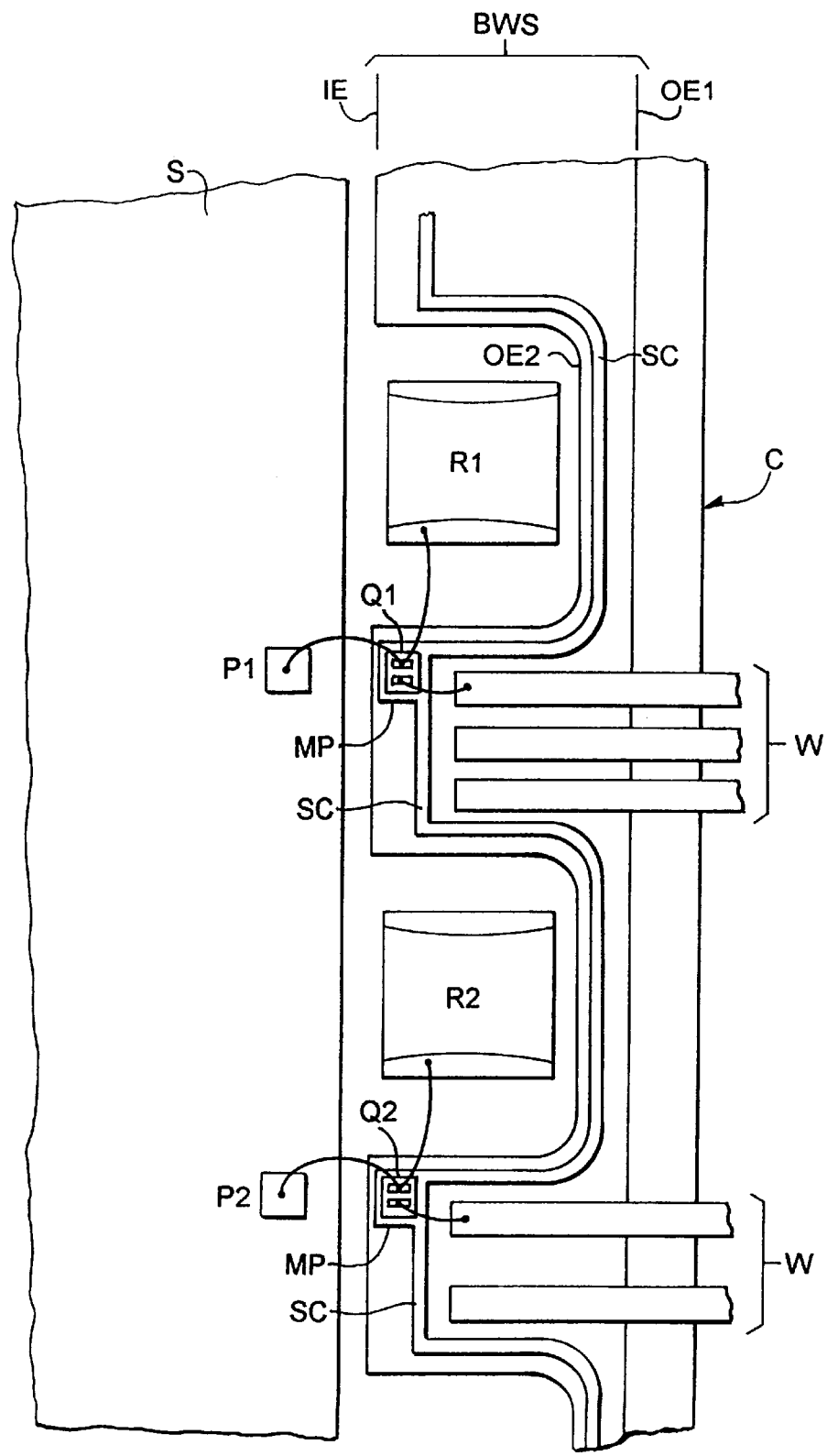
FIG. 1 is a layout diagram depicting a reticulated bonding wire shelf.
Figure 4:
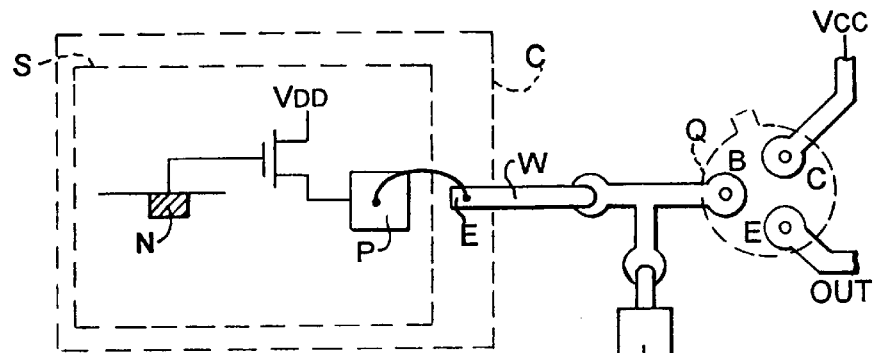
FIG. 4 is a schematic block diagram of a known output circuit.
Figure 5:
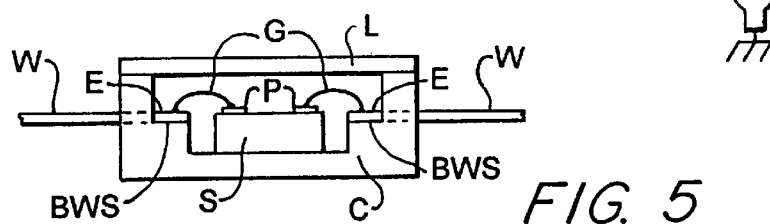
FIG. 5 is a cross section view of a known package.
Figure 6:
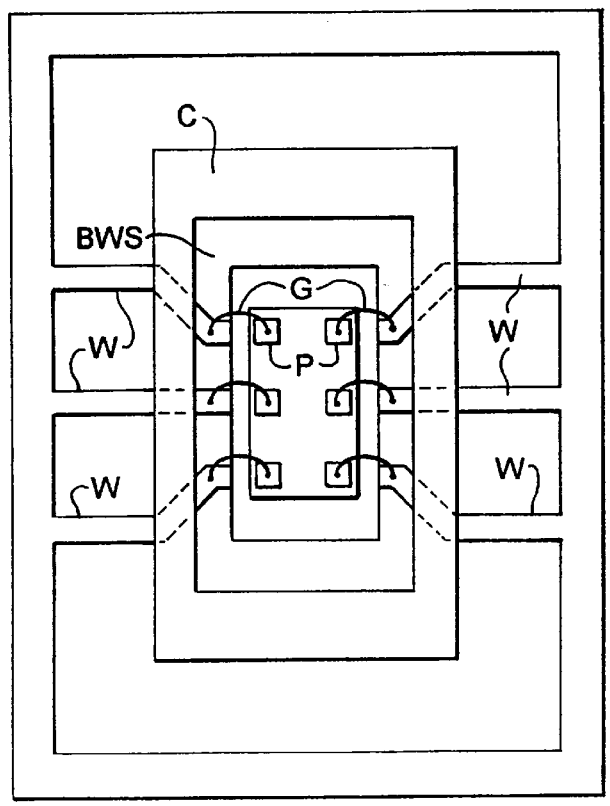
FIG. 6 is a plan view of a known package.

CCD circuit S is mounted in case C. In FIG. 1, an edge portion of case C is depicted, and a corresponding portion of CCD circuit S is depicted into case C. CCD circuit S (only a relevant portion is depicted) includes bonding pads P1 and P2, each supplied with a signal by a corresponding source follower circuit (not shown in FIG. 1) as discussed with respect to FIG. 4. It will be appreciated that the source follower circuit may typically include from one to five MQS transistors, but has on final load resistor.

In FIG. 1, bonding wire shelf BWS is characterized by inward edge IE and outward edge OE1. Bonding wire shelf BWS is reticulated to reveal a plurality of "bays" or reticulations, each reticulation being characterized by inward edge IE and outward edge OE2. In the space of the reticulation, chip resistors R1 and R2 are mounted.

Case C includes a plurality of wires W, ends of which are disposed on bonding wire shelf BWS. Of the plurality of wires W, two are to be connected to pads P1 and P2. On bonding wire shelf BWS is disposed a continuous conductive layer, a first part of which forms one or more mounting pads MP, and second part of which forms serpentine conductor SC linking together the mounting pads MP. Mounting pads MP are disposed on bonding wire shelf BWS adjacent to inward edge IE and close a reticulation. Serpentine conductor SC links together adjacent mounting pads while being routed inward of the ends of wires W and routed outward to be disposed on bonding wire shelf between bonding wire shelf outward edge OE1 and reticulation outward edge OE2.

Figure 2:
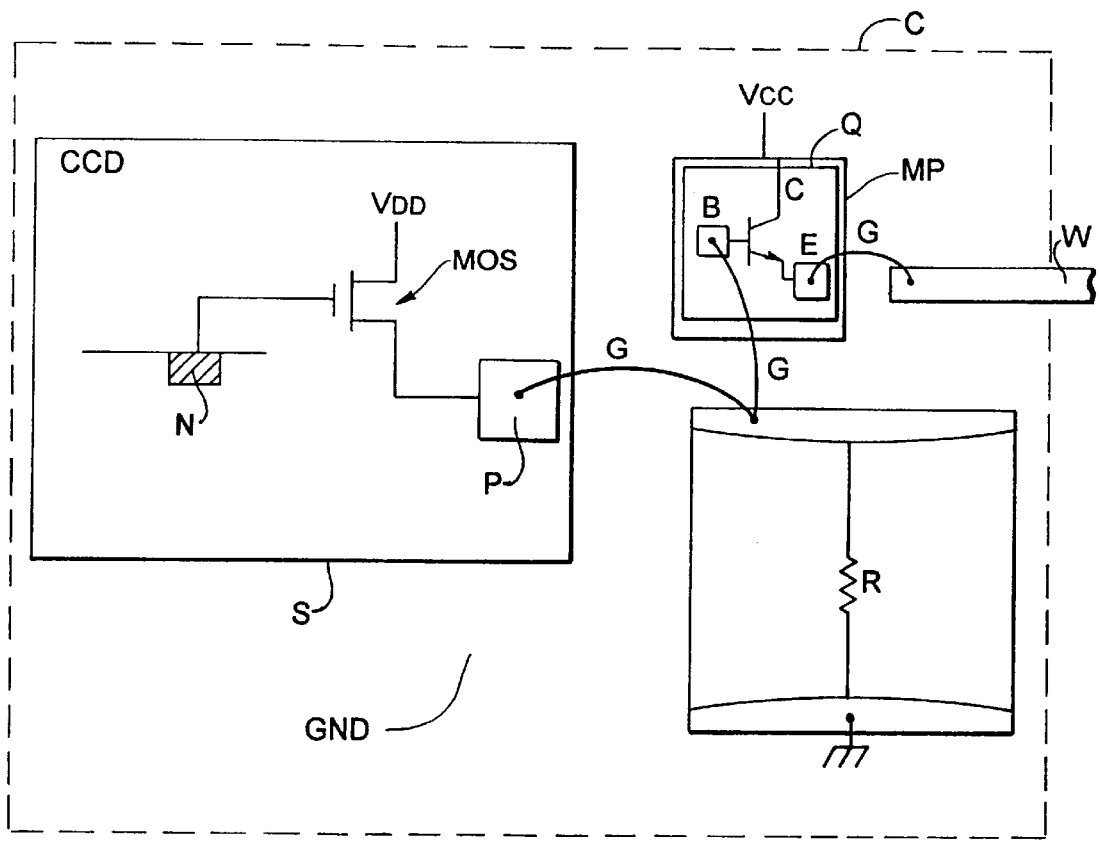
FIG. 2 is a schematic block diagram of an output circuit of the invention.

In FIG. 2, an output arrangement is depicted for semiconductor circuit S mounted in case C. Semiconductor circuit S includes sense node N connected to the gate of an MOS transistor, the MOS transistor being arranged in a source follower circuit with the source of the MOS transistor wired to bonding pad P.

Figure 3:
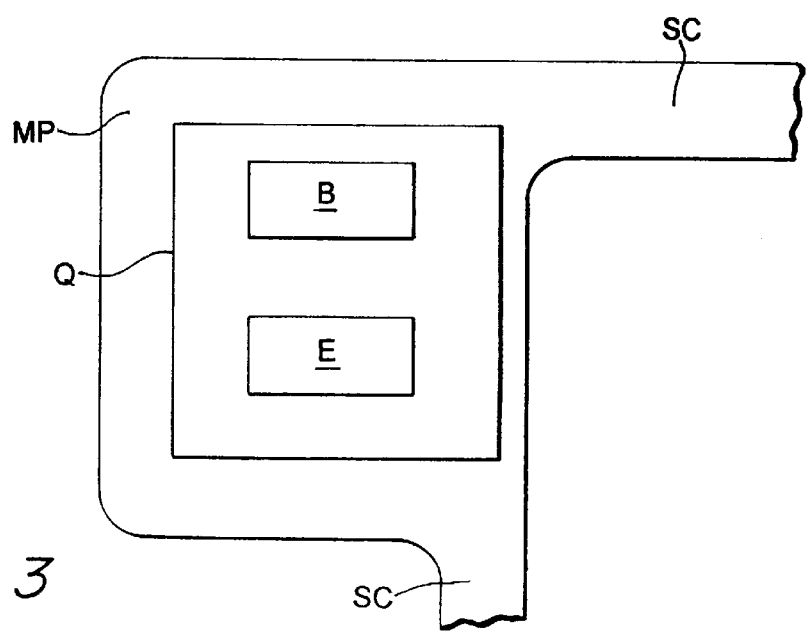
FIG. 3 is a layout diagram of a bipolar chip transistor on a mounting pad.

Bipolar transistor Q is mounted on mounting pad MP. Typically, as depicted in FIG. 3, bipolar transistors include a base bonding pad that is connected to the transistor's base, an emitter bonding pad that is connected to the transistor's emitter, and a back (bonded to the mounting pad) that is connected to the transistor's collector. Since this bipolar chip transistor is mounted on a mounting pad of the conductive layer, it is mounted inside case C.

Similarly, chip resistor R (FIG. 2) is mounted within a reticulation of bonding wire shelf BWS. A first end of chip resistor R is available for bonding to pad P and a second end is bonding to a ground. For example, just as a conductive layer is formed on bonding wire shelf BWS to define mounting pads MP and serpentine conductor SC, another conductive layer GND is formed on the lowest layer of case C onto which semiconductor circuit S is bonded (to define an electrical ground reference) and onto which chip resistor R is bonded (to ground a second end of chip transistor R). Since chip resistor R is mounted in a reticulation in bonding wire shelf BWS, chip resistor R is mounted on the same level as semiconductor circuit S.

In FIG. 2, bonding pad P is connected through a first gold wire G to a first end of chip resistor R and from there to a base bonding pad of transistor Q. While this may be achieved with two separate gold wires G, it is preferably achieved with one gold wire G bonded to circuit parts at three points. A second gold wire G connects the emitter bonding pad of transistor Q to output wire W. Serpentine conductor SC is connected to an output wire W of case C to bring in a collector voltage. In this way, bipolar chip transistor forms an emitter follower circuit energized with the collector voltage from the serpentine conductor but without a load.

In FIG. 1, a reticulation into which chip resistor R1 is mounted, mounting pad MP onto which bipolar chip transistor Q1 is mounted, and output wire W are all disposed adjacent to bonding pad P1 to minimize wire lengths of gold wires G. In this way, chip transistor R1 forms a load for an output source follower circuit on semiconductor circuit S. This arrangement reduces parasitic capacitance to about 2 to 3 picofarads and enables output bandwidth of over 350 MHz to be achieved.

Bipolar chip transistors Q1 and Q2 are typically very small and thin when compared to chip resistors R1 and R2. Quality chip resistors are preferably mounting in reticulations in the bonding wire shelf best achieve equal elevations between bonding pad P1 and a bonding pad for connecting a first end of chip resistor R1.

In large format CCD imaging sensors, very small CCD circuit elements are formed. This circuit type requires (1) high speed output circuits to transfer all of the sensed data through the output circuit in a limited time, and (2) small capacitive loads that may be easily driven by the small size CCD circuit element. At the same time, it is desired to minimize the size of the packaged CCD sensor. In this invention, the reticulation in the bonding wire shelf BWS provides just enough room to house a typically sized chip resistor, so that a cavity in the center of the package need not be much larger than the size of the CCD imaging sensor. The bipolar chip transistors are small enough to be mounted on bonding wire shelf BWS itself.

The capacitive load on a CCD sensor or MOS circuit is reduced, the output bandwidth is increased, and increases the bandwidth of the bipolar emitter follower amplifier while operating at a lower current and power consumption. This packaging arrangement reduces the component count needed outside the package while maintaining the package dimensions no greater than that required to include the semiconductor circuit or CCD sensor (i.e., the large area circuit or large format CCD sensor).

Having described preferred embodiments of a novel semiconductor circuit package with a reticulated bond shelf (which are intended to be illustrative and not limiting), it is noted that modifications and variations can be made by persons skilled in the art in light of the above teachings. For example, discrete time sampled signals (e.g., CCD charge packets read out in sequence) is but one of the types of output signals that will benefit from this invention. Other types of signals are invisioned. The semiconductor circuit may have an internal output drive circuit other than a MOS source follower. The bipolar chip transistor is not the only amplifier envisioned to drive signals outside the package. MOS transistors of silicon, GaAs and other technologies are also envisioned. While the unmounted chip transistor is preferred for mounting on the bonding wire shelf, other partially mounted or mounted transistors (or circuits) are envisioned such as beam lead or solder bump mounted. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A component comprising:
    a case with a bond shelf, the bond shelf being characterized by an inward edge and an outward edge and at least one reticulation, each reticulation being characterized by an outward edge and an inward edge, the reticulation inward edge being co-linear with the bond shelf inward edge; and
    a conductive layer formed on the bond shelf, the conductive layer including a mounting pad for each reticulation and a serpentine conductor connecting the mounting pads, the mounting pad being disposed between the inward edge of the reticulation and the outward edge of the reticulation.

2. The component of claim 1, further comprising a chip transistor mounted on a first mounting pad.

3. The component of claim 2, wherein the serpentine conductor includes a first portion disposed between the outward edge of the bond shelf and the outward edge of the reticulation.

4. The component of claim 3, further comprising a plurality of leads, each lead having a first end disposed between the inward edge of the reticulation and the outward edge of the reticulation.

5. The component of claim 1, wherein the serpentine conductor includes a first portion disposed between the outward edge of the bond shelf and the outward edge of the reticulation.

6. The component of claim 5, further comprising a plurality of leads, each lead having a first end disposed between the inward edge of the reticulation and the outward edge of the reticulation.

7. The component of claim 1, further comprising a plurality of leads, each lead having a first end disposed between the inward edge of the reticulation and the outward edge of the reticulation.

8. The component of claim 7, further comprising a chip transistor mounted on a first mounting pad, the chip transistor being connected to a lead of the plurality of leads.

9. The component of claim 1, wherein the case includes a cavity having a bottom, the component further comprising:
   an integrated circuit mounted on the cavity bottom, the integrated circuit including an output pad;
   a chip resistor disposed in a first reticulation, the chip resistor including a first end;
   a chip transistor mounting on a first mounting pad, the chip transitor including an input pad and an output pad; and
   a first bonding wire connecting the integrated circuit output pad to the chip transistor input pad and to the first end of the chip resistor.

10. The component of claim 9, further comprising:
    a plurality of leads, each lead having a first end disposed between the inward edge of the reticulation and the outward edge of the reticulation; and
    a second bonding wire connecting the chip transistor output pad to the first end of a first lead.

11. A method of manufacturing a component comprising steps of:
    forming a case with a bond shelf, the bond shelf being characterized by an inward edge and an outward edge and at least one reticulation, each reticulation being characterized by an outward edge and an inward edge, the reticulation inward edge being co-linear with the bond shelf inward edge; and
    forming a conductive layer on the bond shelf, the conductive layer including a mounting pad for each reticulation and a serpentine conductor connecting the mounting pads, the mounting pad being disposed between the inward edge of the reticulation and the outward edge of the reticulation.

12. The method of claim 11, further comprising a step of mounting a chip transistor on a first mounting pad.

13. The method of claim 12, wherein the step of forming a conductive layer forms the serpentine conductor to include a first portion disposed between the outward edge of the bond shelf and the outward edge of the reticulation.

14. The method of claim 13, further comprising a step of forming a plurality of leads integral with the case, each lead having a first end disposed between the inward edge of the reticulation and the outward edge of the reticulation.

15. The method of claim 11, wherein the step of forming a conductive layer forms the serpentine conductor to include a first portion disposed between the outward edge of the bond shelf and the outward edge of the reticulation.

16. The method of claim 15, further comprising a step of forming a plurality of leads integral with the case, each lead having a first end disposed between the inward edge of the reticulation and the outward edge of the reticulation.

17. The method of claim 11, further comprising a step of forming a plurality of leads integral with the case, each lead having a first end disposed between the inward edge of the reticulation and the outward edge of the reticulation.

18. The method of claim 17, further comprising a step of mounting a chip transistor on a first mounting pad, the chip transistor being connected to a lead of the plurality of leads.

19. The method of claim 11, wherein the step of forming the case includes forming a case cavity having a bottom, the method further comprising steps of:
    mounting an integrated circuit on the cavity bottom, the integrated circuit including an output pad;
    mounting a chip resistor in a first reticulation, the chip resistor including a first end;
    mounting a chip transistor on a first mounting pad, the chip transitor including an input pad and an output pad; and
    connecting a first bonding wire from the integrated circuit output pad to the chip transistor input pad and to the first end of the chip resistor.

20. The method of claim 19, further comprising steps of:
    forming a plurality of leads integral with the case, each lead having a first end disposed between the inward edge of the reticulation and the outward edge of the reticulation; and
    connecting a second bonding wire from the chip transistor output pad to the first end of a first lead.

* * * * *